(12) United States Patent
Lee

(10) Patent No.: US 9,124,241 B2
(45) Date of Patent: Sep. 1, 2015

(54) IMPEDANCE MATCHING APPARATUS

(75) Inventor: Sang Hun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/238,065

(22) PCT Filed: Aug. 3, 2012

(86) PCT No.: PCT/KR2012/006202
§ 371 (c)(1),
(2), (4) Date: Feb. 10, 2014

(87) PCT Pub. No.: WO2013/022237
PCT Pub. Date: Feb. 14, 2013

(65) Prior Publication Data
US 2014/0167878 A1 Jun. 19, 2014

(30) Foreign Application Priority Data

Aug. 8, 2011 (KR) .................. 10-2011-0078626

(51) Int. Cl.
*H03H 7/38* (2006.01)
*H03H 7/40* (2006.01)
*H04B 1/04* (2006.01)
*H04B 1/18* (2006.01)

(52) U.S. Cl.
CPC . *H03H 7/38* (2013.01); *H03H 7/40* (2013.01); *H04B 1/0458* (2013.01); *H04B 1/18* (2013.01)

(58) Field of Classification Search
CPC .............................. H04B 1/0458; H01Q 1/05
USPC ......... 455/107, 123, 78, 115.1, 121; 333/124, 333/17.3
See application file for complete search history.

(56) References Cited

U.S. PATENT DOCUMENTS

| 3,995,237 A | 11/1976 | Brunner |
| 6,895,225 B1 | 5/2005 | Talvitie et al. |
| 6,934,557 B2 * | 8/2005 | Sekine et al. .............. 455/550.1 |

FOREIGN PATENT DOCUMENTS

| EP | 1041723 A2 | 10/2000 |
| JP | 04-368022 A | 12/1992 |
| JP | 404368022 | * 12/1992 |
| KR | 10-2004-0070618 A | 8/2004 |
| KR | 10-2006-0112722 | 11/2006 |
| KR | 10-2007-0023850 A | 3/2007 |

OTHER PUBLICATIONS

International Search Report in International Application No. PCT/KR2012/006202, filed Aug. 3, 2012.
Notice of Allowance dated Jul. 20, 2013 in Korean Application No. 10-2011-0078626.
European Search Report in European Application No. 12821779.1, dated Feb. 13, 2015.

* cited by examiner

*Primary Examiner* — Dinh Le
(74) *Attorney, Agent, or Firm* — Saliwanchik, Lloyd & Eisenschenk

(57) ABSTRACT

Disclosed is an impedance matching apparatus performing impedance matching between a front-end module and an antenna. The impedance matching apparatus includes an RF front end providing a multi-band RF signal, a reflected power measuring module measuring a reflection coefficient for the RF input signal, a matching unit adjusting impedance so that the reflection coefficient is minimized, a first switch module provided in the RF front end to selectively switch the RF signal onto a bypass path, and a controller allowing the RF signal to be switched onto the bypass path if a specific frequency range is detected from the reflection coefficient.

15 Claims, 3 Drawing Sheets

IMPEDANCE MATCHING APPARATUS

CROSS-REFERENCE TO RELATED APPLICATIONS

This application is the U.S. national stage application of International Patent Application No. PCT/KR2012/006202, filed Aug. 3, 2012, which claims priority to Korean Application No. 10-2011-0078626, filed Aug. 8, 2011, the disclosures of each of which are incorporated herein by reference in their entirety.

TECHNICAL FIELD

The disclosure relates to an impedance matching apparatus. In more particular, the disclosure relates to an impedance matching apparatus capable of improving wireless performance.

BACKGROUND ART

In general, a mobile communication terminal has been broadbanded to employ a global system for mobile communication (GSM) scheme/a wideband code division multiple access (WCDMA) scheme which are different communication schemes.

To this end, an antenna apparatus of the mobile communication terminal includes an antenna, and a front-end module connected with the antenna, and further includes a variable impedance matching apparatus for impedance matching between the antenna and the front-end module.

Although a conventional variable impedance matching apparatus can easily adjust a frequency to obtain a desirable antenna resonance point, the insertion loss of predetermined dB may be caused due to the characteristic of the variable impedance matching apparatus including active variable devices.

Accordingly, the insertion loss of the variable impedance matching apparatus becomes greater than the insertion loss of a fixed impedance matching apparatus at a specific frequency range, so that the wireless performance may be deteriorated.

DISCLOSURE OF INVENTION

Technical Problem

An object of the disclosure is made by taking the above problem into consideration, and to provide an impedance matching apparatus capable of improving wireless performance of a mobile communication terminal.

Another object of the disclosure is to provide an impedance matching apparatus capable of switching an RF signal on a bypass path by using a switch.

Still another object of the disclosure is to provide an impedance matching apparatus capable of minimizing a parasitic component generated from a switch by using an RF MEMS switch.

Still another object of the disclosure is to provide an impedance matching apparatus capable of facilitating switch installation by using a double pole-type switch provided in an RF front end.

Solution to Problem

According to the embodiment of the disclosure, there is provided an impedance matching apparatus performing impedance matching between a front end module and an antenna. The impedance matching apparatus includes an RF front end providing a multi-band RF signal, a reflected power measuring module measuring a reflection coefficient for the RF input signal, a matching module adjusting impedance so that the reflection coefficient is minimized, a first switch module provided in the RF front end to selectively switch the RF signal onto a bypass path, and a controller allowing the RF signal to be switched onto the bypass path if a specific frequency range is detected from the reflection coefficient.

According to an embodiment of the disclosure, there is provided an impedance matching apparatus performing impedance matching between a front end module and an antenna. The impedance matching apparatus includes an RF front end providing a multi-band RF signal, a directional-coupler separating a transmit signal, which is input from the RF front end, from a reflected signal which is reflected from the antenna, a detector detecting a transmit voltage from the transmit signal and detecting a reflected voltage from the reflected signal, a matching module adjusting an impedance based on a difference between the transmit voltage and the reflected voltage, a first switch module provided in the RF front end to selectively switch the RF signal onto a bypass path, and a controller allowing the RF signal to be switched onto the bypass path if a specific frequency range is detected.

Advantageous Effects of Invention

As described above, according to the disclosure, the impedance matching is not performed at a specific frequency range, thereby preventing the impedance matching efficiency from being degraded due to the insertion loss of the matching module.

In addition, according to the disclosure, the RF signal is easily switched to the bypass path by using a switch.

In addition, according to the disclosure, the RF MEMS switch is used, so that the parasitic component generated from a switch can be minimized.

Further, according to the disclosure, the double pole-type switch is provided in the RF front end as the switch instead of the single pole-type switch, thereby facilitating switch installation.

BEST MODE FOR CARRYING OUT THE INVENTION

Hereinafter, embodiments of the disclosure will be described in detail with reference to drawings.

Figure 1:
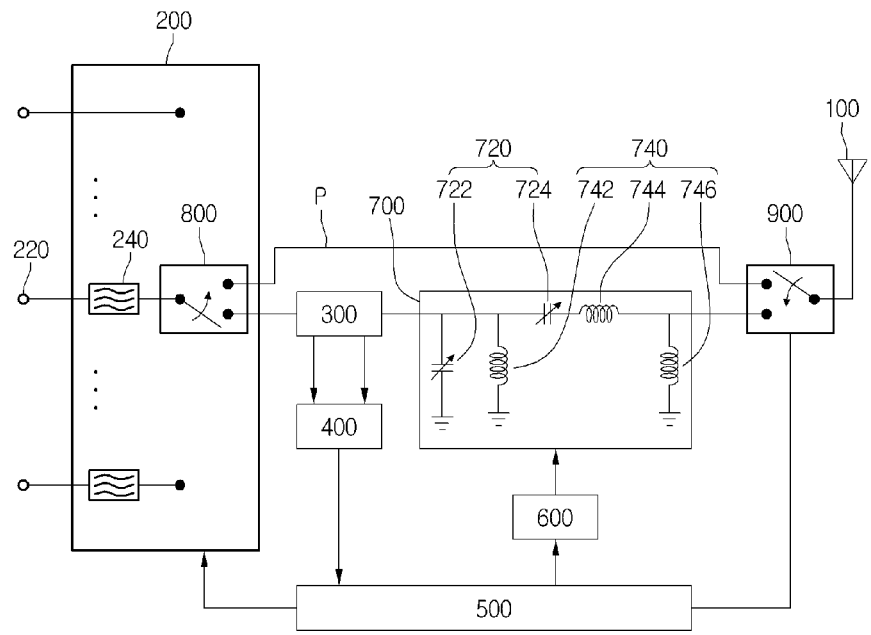
FIG. 1 is a block diagram showing an impedance matching apparatus including a switch module according to the disclosure.
Figure 2:
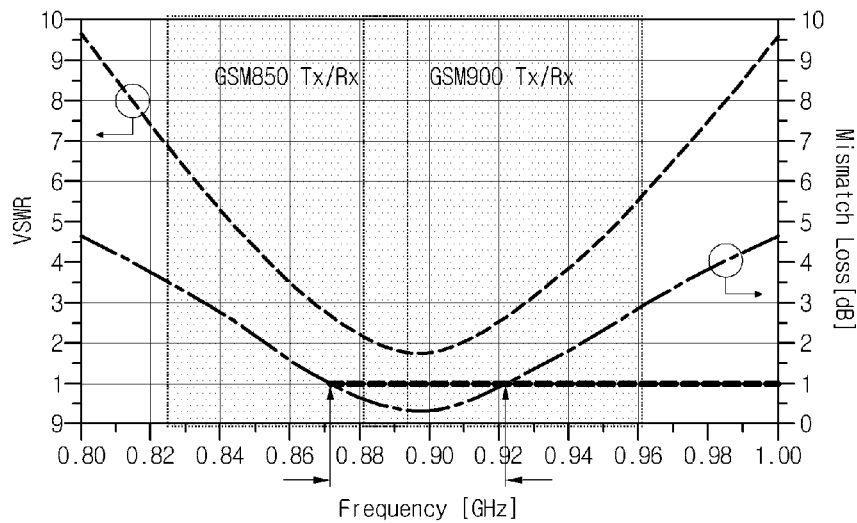
FIG. 2 is a graph showing mismatch loss according to insertion loss of the impedance matching apparatus according to the disclosure.
Figure 3:
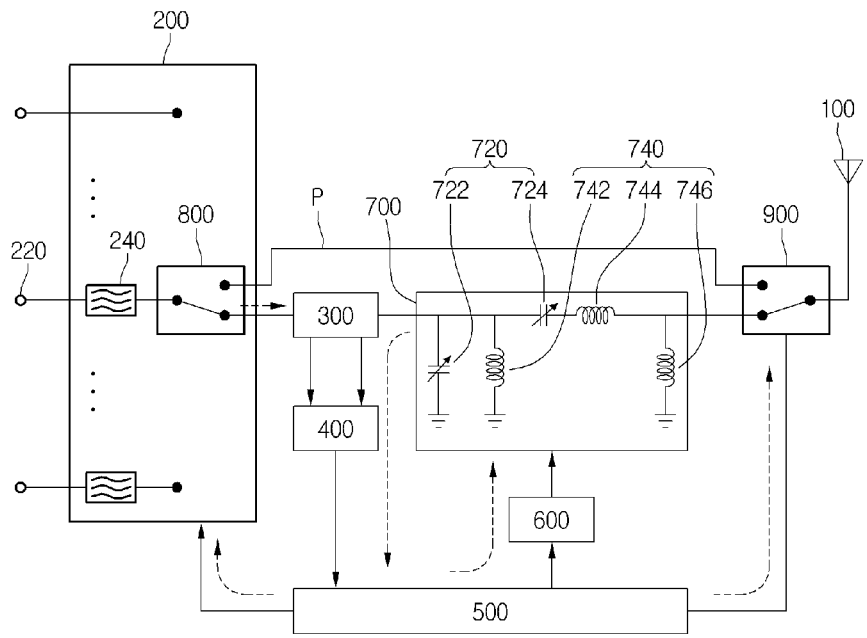
FIGS. 3 and 4 are block diagrams showing the operation of the switch module according to the disclosure.
Figure 4:
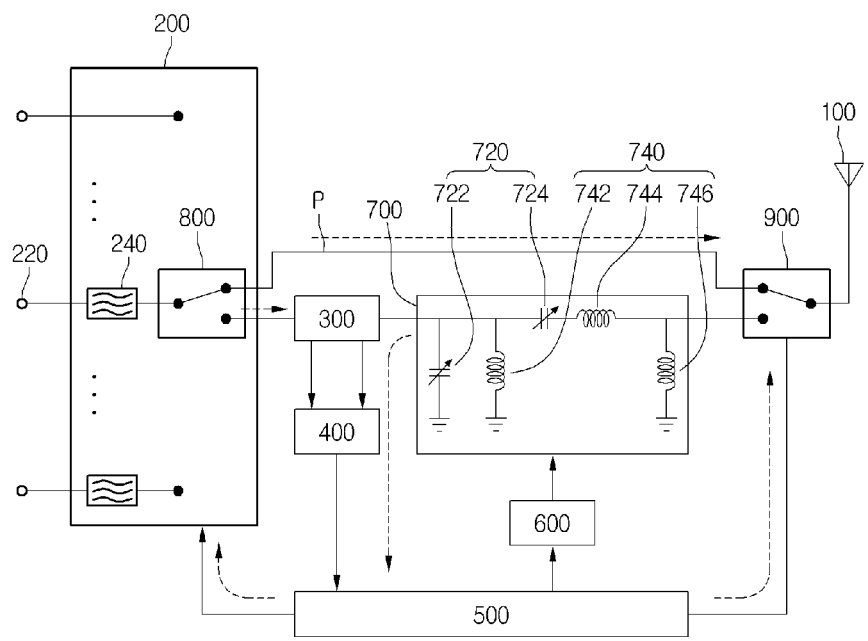

FIG. 1 is a block diagram showing an impedance matching apparatus including a switch module according to the disclosure, FIG. 2 is a graph showing mismatch loss according to insertion loss of the impedance matching apparatus according to the disclosure, and FIGS. 3 and 4 are block diagrams showing the operation of the switch module according to the disclosure.

Referring to FIG. 1, the impedance matching apparatus according to the disclosure includes an RF front end 200 to provide a multi-band RF signal, a reflected power measuring module 300 to measure the reflection coefficient for the RF input signal, a matching module 700 to adjust a variable capacitor 720 so that the reflection coefficient is minimized, switching modules 800 and 900 to selectively switch the RF signal onto a bypass path P, and a controller 500 to apply a control signal so that the RF signal is switched onto the bypass path P if a specific frequency is detected from the reflection coefficient.

The RF front end 200 provides multi-band transceive RF signals. For example, the RF front end may provide transceive signals having at least penta-bands. Accordingly, the RF front end can make communication through a wide code division multiple access (W-CDMA) scheme or a global system for mobile communication (GSM) scheme.

The RF front end 200 may include a plurality of terminals 220 to provide multi-frequency bands. The terminals 220 may provide WCSMA 850TRx, WCDMA 1900TRx, WCDMA 2100TRx, GSM 850/900Tx, GSM 1800/1900Tx, GSM 850Rx, GSM 900Rx, GSM 1800Rx, and GSM 1900Rx signals. The multi-band RF input signal may be changed.

The terminal 220 may be connected to a low pass filter 240, and a terminal to process a GSM signal may be connected to a band pass filter.

The RF input signal generated from the RF front end 200 is provided to an antenna 100, and the antenna 100 may output the RF input signal received therein to the outside.

The reflected power measuring module 300 is connected to the antenna 100 to measure the reflected power according to the RF input signal from the antenna 100, for example, the reflection coefficient.

The reflected power measuring module 300 may include a directional coupler and a detector.

The directional coupler may separate an input signal input from the RF front end 200 and a reflection signal reflected from the antenna 100 from each other.

The detector may detect transmit power from the separated transmit signal, and the reflected power from the separated reflection signal.

The controller 500 may adjust the impedance of the matching module 700 based on the transmit power and the reflected power that have been detected. According to one embodiment, the controller 500 may control the matching module 700 so that the difference between the transmit power and the reflected power is maximized.

The reflected power measuring module 300 may be additionally connected to an AD converter. The AD converter 400 converts an analog signal measured by the reflected power measuring module 300 into a digital signal. Simultaneously, the AD converter 400 can covert the RF input signal into a digital signal.

The matching module 700 controls capacitors so that the reflection coefficient is minimized. Therefore, the matching module 700 can easily perform impedance matching between an RF input signal and an RF output signal by performing a control operation to minimize the reflection coefficient.

To this end, the matching module 700 may include a plurality of variable capacitors 720 and a plurality of fixed inductors 740. The variable capacitors 720 may include a first variable capacitor 722 and a second variable capacitor 724. The first variable capacitor 722 is parallel-connected to an RF rear end, and the second variable capacitor 724 is series-connected to the RF rear end.

The fixed inductors 740 may include a first inductor 742, a second inductor 744, and a third inductor 746. The first inductor 742 is series-connected to the RF rear end, and the second inductor 744 is parallel-connected to the third inductor 746.

The connections between the variable capacitors 720 and the fixed inductors 740 and the number of devices may be varied according to the embodiments.

The matching module 700 may receive a signal according to the control signal of the controller 500. In more detail, the controller 500 may provide signals to the variable capacitors to adjust the capacitances of the variable capacitors 720 so that the optimal tuned values can be found.

Meanwhile, if the impedance matching is performed by the matching module 700 at a specific frequency in which the mismatch loss (ML) caused by the impedance mismatching becomes less than the insertion loss of the matching module 700, wireless performance may be degraded.

As shown in FIG. 2, regarding a low frequency band characteristic of a multi-band antenna, antenna performance is degraded at the boundary frequency in the whole frequency ranges (that is, frequency range of 824 MHz to 960 MHz) of mobile communication GSM 850 and GSM 900 schemes, and the mismatch loss of about 3.5 dB may be caused.

In other words, the total radiated power (TRP) of about 3.5 dB or the degradation of the total isotropic sensitivity (TIS) may be caused due to the impedance mismatching.

The mismatch loss may be determined by Equation 1.

$$ML = -10\mathrm{LOG}\left\{1 - \left[\frac{VSWR - 1}{VSWR + 1}\right]\right\} \qquad \text{[Equation 1]}$$

(VSWR=voltage standing wave ratio)

In this case, the VSWR may be found by measuring the reflection coefficient of the antenna 100. The VSWR may be determined by Equation 2.

$$SWR = \frac{1 + |\text{reflection coefficient}|}{1 - |\text{reflection coefficient}|} \qquad \text{[Equation 2]}$$

On the assumption that the insertion loss of the matching module 700 is 1 dB, the mismatch loss is 1 dB or more at a specific frequency range, for example, the frequency range of 870 MHz to 920 MHz. Accordingly, the insertion loss of the matching module 700 is greater than the mismatch loss.

Therefore, since the variable impedance matching apparatus is used at the frequency range of 870 MHz to 920 MHz, wireless performance may be more degraded.

The specific frequency range is a frequency band in which the mismatch loss becomes less than the insertion loss of the matching module 700, and may vary according to the frequency bands.

In order to solve the above problem, the impedance matching apparatus may further include the switch modules 800 and 900 to switch the RF signal onto the bypass path.

Referring to FIG. 1 again, the switch module may further include the first and second switch modules 800 and 900.

The first switch module 800 may be provided in the RF front end 200, and may include a double pole-type switch. Accordingly, if the RF signal has a specific frequency range, the RF input signal may be switched onto the bypass path P. If the RF signal does not have the specific frequency range, the RF input signal may be switched to the RF path instead of the bypass path P.

Since the structure is obtained by replacing a single pole-type switch used in a conventional RF front end 200 with the double pole type switch, the installation of the double pole switch may be significantly simplified.

The double pole-type switch may include an RF switch. In particular, an RF MEMS switch representing significantly-less insertion loss can be employed. The RF MEMS switch minimizes the parasitic component generating from the RF MEMS switch, thereby preventing the loss caused in the switch from being greater than the insertion loss of the matching module 700.

The second switch module 900 may be provided on the bypass path P. In more detail, the second switch module 900 is provided between the antenna 100 and the matching module 700, so that the second switch module 900 can be selectively switched to the bypass path P and the RF path.

Similarly to the first switch module 800, the second switch module 900 may include an RF switch. More effectively, the second switch module 900 may include an RF MEMS switch.

As shown in FIG. 3, if the RF signal does not have a specific frequency based on the reflection coefficient, the controller 500 operates the first and second switch modules 800 and 900, so that the RF signal can be transferred to the matching module 700.

In contrast, as shown in FIG. 4, if the RF signal has a specific frequency based on the reflection coefficient, the controller 500 may operate the first and second switch modules 800 and 900 so that the RF signal passes through the bypass path P. Thereafter, the RF signal is not subject to the impedance matching.

Hereinafter, the impedance matching method according to the disclosure will be described in more detail with reference to FIG. 5.

Figure 5:
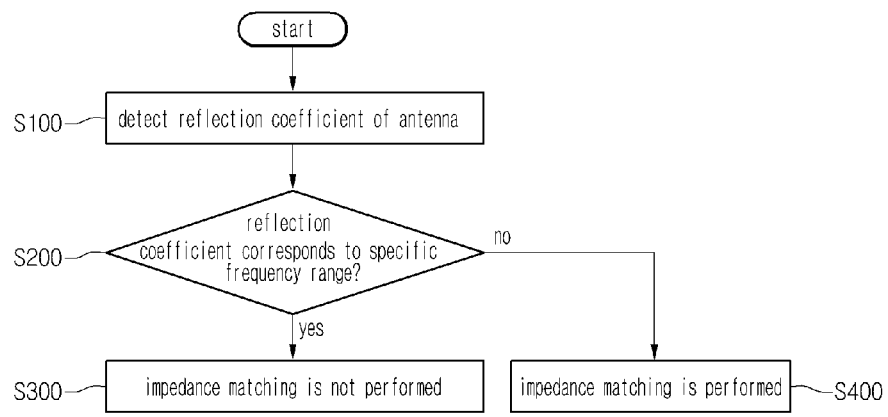
FIG. 5 is a flowchart showing an impedance matching method according to the disclosure.

As shown in FIG. 5, the impedance matching method according to the disclosure includes a step of detecting the reflection coefficient of an RF signal, a step of performing impedance matching to minimize the reflection coefficient, and a step of bypassing the RF signal without the impedance matching if the reflection coefficient represents a specific frequency.

First, a step of detecting the reflection coefficient from the antenna 100 is performed (step S100). The reflection coefficient of the antenna 100 may be detected by the reflected power measuring module 300.

Thereafter, a step of determining if the frequency of the RF signal is in the specific frequency range based on the reflection coefficient may be performed (step S200).

The specific frequency range may be determined as a range in which the mismatch loss becomes less than the insertion loss of the matching module 700, and determined by the mismatch loss.

The mismatch loss may be determined by Equations 1 and 2, and may be measured based on the VSWR and the reflection coefficient of the antenna 100.

Thereafter, if the frequency of the RF signal is not in the specific frequency range, the step of performing the impedance matching may be performed (step S400).

The impedance matching may be performed by adjusting the variable capacitors 720 of the matching module 700, and the variable capacitors 720 may be adjusted in various sequences according to the embodiments.

In contrast, if the frequency of the RF signal is in the specific frequency, the impedance matching may not be performed (step S300).

To this end, the controller 400 may switch the first and second switch modules 800 and 900 so that the RF signal is switched to the bypass path P. In this case, the first and second switch modules 800 and 900 may include an RF MEMS switch.

As described above, according to the disclosure, the impedance matching is not performed at a specific frequency range, thereby preventing the impedance matching efficiency from being degraded due to the insertion loss of the matching module, so that the wireless performance can be improved.

Although the exemplary embodiments of the disclosure have been described, it is understood that the disclosure should not be limited to these exemplary embodiments but various changes and modifications can be made by one ordinary skilled in the art within the spirit and scope of the disclosure as hereinafter claimed.

The invention claimed is:

1. An impedance matching apparatus, comprising:
   an RF front end generating an RF signal;
   an antenna outputting the RE signal generated from the RF front end;
   a reflected power measuring module disposed between the RF front end and the antenna and measuring a reflection coefficient according to the RF signal from the antenna;
   a matching unit disposed between the reflected power measuring module and the antenna and adjusting impedance so that the reflection coefficient is minimized;
   a first switch module disposed between the RF front end and the reflected power measuring module to selectively switch the RF signal onto a bypass path or an RF path;
   a second switch module disposed between the matching unit and the antenna to selectively switch the RF signal onto the path or the RF path; and
   a controller detecting a frequency of the RF signal by using the reflection coefficient and allowing the RF signal to be switched onto the bypass path if the frequency is included in a predetermined frequency range,
   wherein the bypass path directly connects the RF front end and the antenna by the first and the second switch modules.

2. The impedance matching apparatus of claim 1, wherein the first switch module is a double pole-type high frequency switch.

3. The impedance matching apparatus of claim 1, wherein the predetermined frequency range is from 824MHz to 960MHz.

4. The impedance matching apparatus of claim 1, wherein the second switch module is an RF MEMS switch.

5. The impedance matching apparatus of claim 1, wherein the predetermined frequency range is a range in which a mismatch loss becomes less than an insertion loss of the matching unit.

6. The impedance matching apparatus of claim 5, wherein the mismatch loss is determined by an equation, $$ML = -10\log\left\{1 - \left[\frac{VSWR-1}{VSWR+1}\right]^2\right\},$$

in which a VSWR refers to a voltage standing wave ratio.

7. The impedance matching apparatus of claim 6, wherein the VSWR is determined by an equation, $$= \frac{1 + |\text{reflection coefficient}|}{1 - |\text{reflection coefficient}|}.$$

8. The impedance matching apparatus of claim 1, wherein the matching unit includes at least one variable capacitor and at least one inductor.

9. The impedance matching apparatus of claim 8, wherein the controller minimizes the reflection coefficient by adjusting a capacitance of the at least one variable capacitor.

10. An impedance matching apparatus, comprising:
an RF front end generating an RF signal;
an antenna outputting the RF signal generated from the RF front end;
a reflected power measuring module disposed between the RF front end and the antenna, wherein the reflected power measuring module comprises a directional-coupler separating a transmit signal, which is input from the RF front end, from a reflected signal which is reflected from the antenna, and a detector detecting a transmit voltage from the transmit signal and detecting a reflected voltage from the reflected signal;
a matching unit disposed between the reflected power measuring module and the antenna and adjusting an impedance based on a difference between the transmit voltage and the reflected voltage;
a first switch module disposed between the RF front end and the reflected power measuring module to selectively switch the RF signal onto a bypass path or an RF path;
a second switch module disposed between the matching unit and antenna to selectively switch RF signal onto the bypass path or the RF path; and
a controller detecting a frequency of the RF signal by using the reflection coefficient and allowing the RF signal to be switched onto the bypass path if the frequency is included in a predetermined frequency range,
wherein the bypass path directly connects the RF front end and the antenna by the first and the second switch modules.

11. The impedance matching apparatus of claim 10, wherein the first switch module is a double pole-type high frequency switch.

12. The impedance matching apparatus of claim 10, wherein the predetermined frequency range is from 824MHz to 960MHz.

13. The impedance matching apparatus of claim 10, wherein the predetermined frequency range is a range in which a mismatch loss becomes less than an insertion loss of the matching unit.

14. The impedance matching apparatus of claim 10, wherein the matching unit includes at least one variable capacitor and at least one inductor.

15. The impedance matching apparatus of claim 14, wherein the controller maximizes a difference between the transmit voltage and the reflected voltage by adjusting a capacitance of the at least one variable capacitor.

* * * * *